United States Patent
Luong et al.

(10) Patent No.: US 10,260,150 B2
(45) Date of Patent: Apr. 16, 2019

(54) METHOD AND SYSTEM FOR SCULPTING SPACER SIDEWALL MASK

(71) Applicant: Tokyo Electron Limited, Tokyo (JP)

(72) Inventors: Vinh Luong, Guilderland, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/906,660

(22) Filed: Feb. 27, 2018

(65) Prior Publication Data

US 2018/0187308 A1 Jul. 5, 2018

Related U.S. Application Data

(63) Continuation of application No. 15/227,096, filed on Aug. 3, 2016, now abandoned.
(Continued)

(51) Int. Cl.
*C23C 16/52* (2006.01)
*H01L 21/32* (2006.01)
(Continued)

(52) U.S. Cl.
CPC ........ *C23C 16/52* (2013.01); *C23C 16/45525* (2013.01); *H01L 21/0337* (2013.01);
(Continued)

(58) Field of Classification Search
CPC ............... C23C 16/52; C23C 16/45525; H01L 21/32139; H01L 21/32137; H01L 21/31116; H01L 21/0337; H01L 21/31122
See application file for complete search history.

(56) References Cited

U.S. PATENT DOCUMENTS

| | | |
|---|---|---|
| 5,877,090 A | 3/1999 | Padmapani et al. |
| 8,809,199 B2 | 8/2014 | Nishizuka |
| (Continued) | | |

OTHER PUBLICATIONS

Nakayama et al., "Self-aligned double and quadruple patterning layout principle", Proc SPIE 8327, Design for Manufacturability through Design-Process Integration VI, 83270V, Mar. 14, 2012, 10 pp.

*Primary Examiner* — Nadine G Norton
*Assistant Examiner* — Mahmoud Dahimene
(74) *Attorney, Agent, or Firm* — Wood Herron & Evans LLP

(57) ABSTRACT

Provided is a method of forming a spacer sidewall mask, the method comprising: providing a substrate in a process chamber, the substrate having a carbon mandrel pattern and an underlying layer, the underlying layer comprising an amorphous silicon layer above a silicon nitride layer; performing a breakthrough etch process including growth of a conformal native silicon oxide layer, creating an ALD patterned structure; performing a spacer sidewall sculpting process on the ALD patterned structure; performing an amorphous silicon main etch (ME) process on the ALD patterned structure, the ME process causing a spacer oxide open and carbon mandrel removal; and performing an amorphous silicon ME over etch (OE) process on the ALD spacer oxide pattern, the ME OE process transferring the ALD spacer oxide pattern into the amorphous silicon layer, generating a first sculpted pattern comprising a first sculpted sub-structure with a trapezoidal shape.

16 Claims, 12 Drawing Sheets

Related U.S. Application Data

(60) Provisional application No. 62/205,968, filed on Aug. 17, 2015.

(51) Int. Cl.
   *H01L 21/033*    (2006.01)
   *H01L 21/311*    (2006.01)
   *H01L 21/3213*   (2006.01)
   *C23C 16/455*    (2006.01)

(52) U.S. Cl.
   CPC .. *H01L 21/31116* (2013.01); *H01L 21/31122* (2013.01); *H01L 21/32137* (2013.01); *H01L 21/32139* (2013.01)

(56) References Cited

U.S. PATENT DOCUMENTS

| | | |
|---|---|---|
| 9,412,617 B2 | 8/2016 | Narishige et al. |
| 9,472,414 B2 | 10/2016 | Yang et al. |
| 2007/0238308 A1 | 10/2007 | Niroomand et al. |
| 2012/0208369 A1 | 8/2012 | Nishizuka |
| 2015/0287612 A1* | 10/2015 | Luere ................. H01L 21/0274 438/703 |
| 2016/0005650 A1 | 1/2016 | Yang et al. |

* cited by examiner

* Pitch Imbalance = sum[abs(P1-P2);abs(P2-P3);abs(P3-P4);abs(P4-P1)]

METHOD AND SYSTEM FOR SCULPTING SPACER SIDEWALL MASK

The present application claims the benefit of U.S. patent application Ser. No. 15/227,096, filed on Aug. 3, 2016, entitled "Method and System for Sculpting Spacer Sidewall Mask," which is incorporated herein by reference in its entirety.

BACKGROUND OF THE INVENTION

Field of the Invention

The invention relates to a method and system of patterning of a film on a substrate and specifically to a method and system of enhancing the structure profile on the substrate to meet patterning objectives.

Description of Related Art

In semiconductor manufacturing, patterning of a film on a substrate can be achieved through several methods that have evolved with time to follow Moore's law. Double patterning is the technique used to create hard mask features smaller than photolithographic capabilities by using spacer deposition to define feature dimensions. Typical double patterning (DP) techniques require a sequence of deposition over a mandrel, etch to form the spacer and another etch to remove the mandrel, with both deposition and etch tools required. There are some spatial limitations inherent in the conventional DP technique due to deposition 'thin-ness' limitations and pitch of the features from mandrel formation limitations.

Self-aligned double and quadruple patterning and other patterning schemes require a spacer to be formed on the sidewall of a pre-patterned feature. The pre-patterned feature is then removed leaving the spacer as the mask for subsequent patterning. A lot has been done on self-aligned double patterning (SADP) and quadruple patterning (SAQP) for patterning scheme layout but not a lot has been done on focusing and tuning the spacer sidewall mask using reactive ion etch (RIE) for patterning. The spacer sidewall profile has a large impact on subsequent patterning steps in an integration scheme. There is a need for techniques using reactive ion etch to achieve a spacer sidewall mask profile that will help to achieve better profiles in subsequent patterning steps. There is also a need for fabricating a pattern that lands on silicon nitride without creating a recess on the silicon nitride, without causing an undercut in the spacer sidewall, and use current gas reactant mixtures to get high selectivity to the silicon nitride.

SUMMARY OF THE INVENTION

Provided is a method of forming a spacer sidewall mask, the method comprising: providing a substrate in a process chamber, the substrate having a carbon mandrel pattern and an underlying layer, the underlying layer comprising an amorphous silicon layer above a silicon nitride layer; performing a breakthrough etch process including growth of a conformal native silicon oxide layer, creating an ALD patterned structure; performing a spacer sidewall sculpting process on the ALD patterned structure; performing an amorphous silicon main etch (ME) process on the ALD patterned structure, the ME process causing a spacer oxide open and carbon mandrel removal; and performing an amorphous silicon ME over etch (OE) process on the ALD spacer oxide pattern, the ME OE process transferring the ALD spacer oxide pattern into the amorphous silicon layer, generating a first sculpted pattern comprising a first sculpted sub-structure with a trapezoidal shape.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 2B is an exemplary schematic of the spacer profile fabricated using the present invention techniques and methods, while

FIG. 3A is an exemplary schematic of a structure profile where process parameters are adjusted to affect the collision path of the ions in one embodiment of the present invention whereas

DETAILED DESCRIPTION OF SEVERAL EMBODIMENTS

In the following description, for purposes of explanation and not limitation, specific details are set forth, such as a particular geometry of a processing system, and descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1:
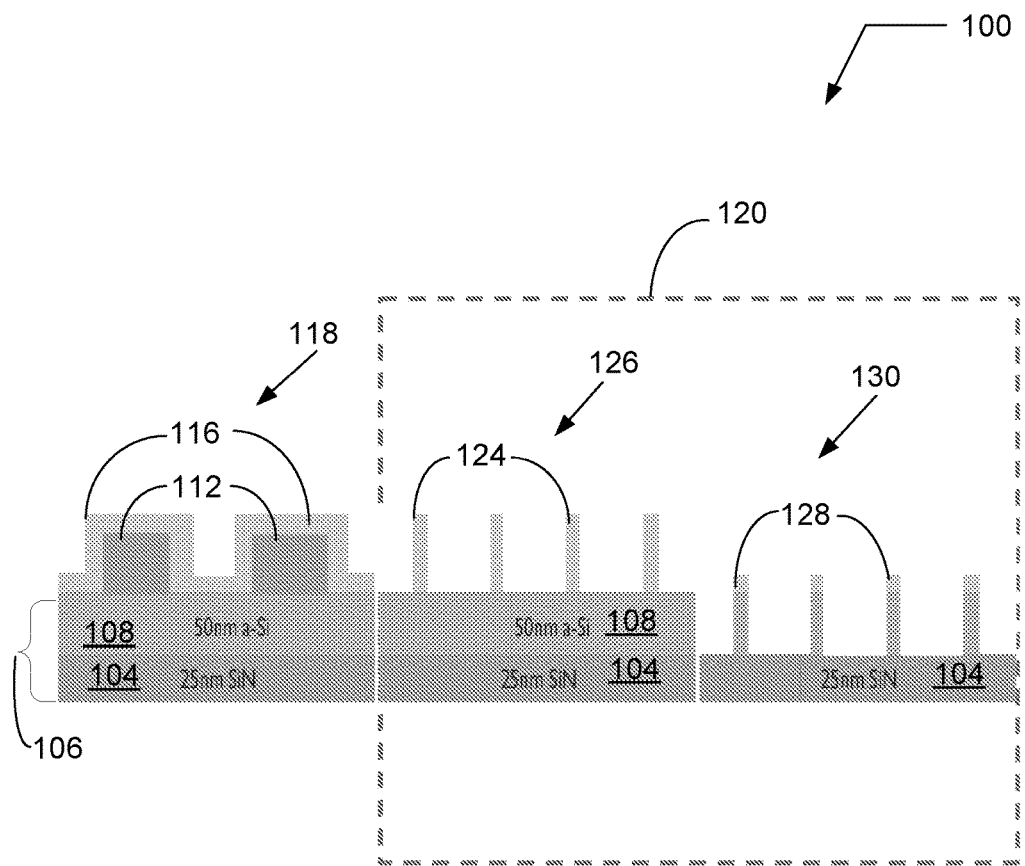
FIG. 1 is an exemplary schematic of an integration scheme showing the area of interest of the present invention.

FIG. 1 is an exemplary schematic 100 of an integration scheme showing the area of interest 120 of the present invention. The integration scheme starts with spacer oxide formation step 118 where a mandrel 112, for example, a carbon mandrel is positioned above underlying layer 106 comprising amorphous silicon or a-Si 108 layer above a silicon nitride layer 104. Above the mandrel 112 is a conformal spacer oxide layer 116 formed by atomic layer deposition (ALD) that will be processed with process steps in the area of interest 120 of the integration scheme. Included in the area of interest 120 are an ALD spacer oxide etch open step and a mandrel removal step 126 creating spacer structures 124, and a pattern transfer step 130 onto the a-Si layer 108 creating spacer structures 128.

Figure 2A:
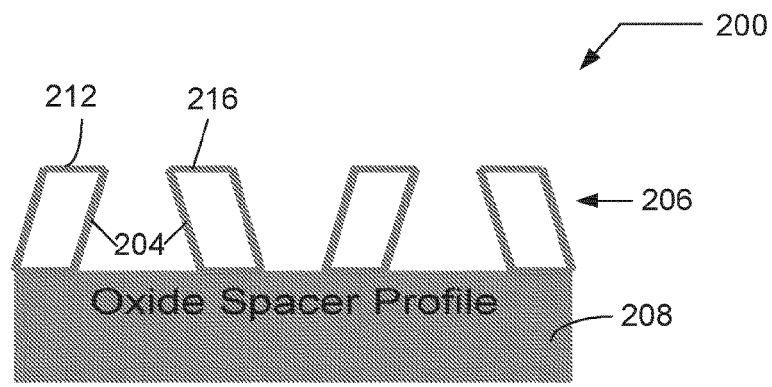
FIG. 2A is an exemplary schematic of the oxide spacer profile of the structures using prior art methods of processing the oxide spacer without using the processes of the present invention.
Figure 2B:
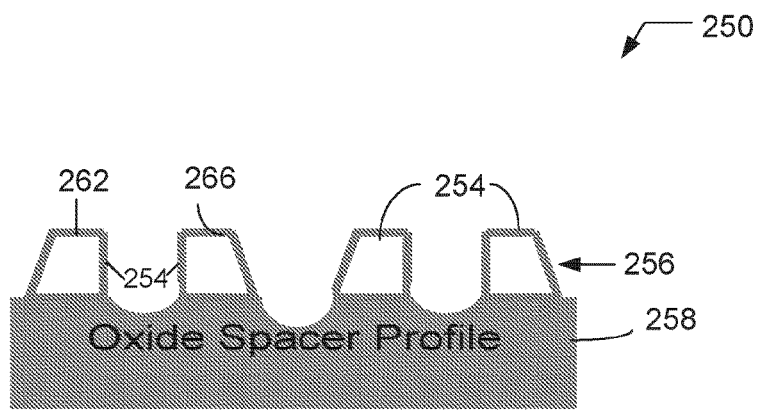

FIG. 2A is an exemplary schematic 200 of the oxide spacer profile of the structures 206 using prior art methods of processing the oxide spacer whereas FIG. 2B is an exemplary schematic 250 of the spacer profile when the present invention techniques and methods are used. Referring to FIG. 2A, structures 206 such as structure pair 204 above the underlying layer 208 have a parallelogram shape. The first structure 212 of structure pair 204 is leaning to the right and a second structure 216 of the structure pair 204 is leaning to the left. Structures 206 exist after the ALD spacer oxide etch open step and mandrel removal step referred to above, and before the pattern transfer step into the a-Si layer. Referring to FIG. 2B, structures 256 such as structure pair 254 above the underlying layer 258, comprises a first structure 262 which is a right trapezoidal shape with the slanted side on the left and a second structure 266 which is a right trapezoidal shape with the slanted side on the right. The structures 256 exist after the structures 206 are sculpted in accordance with the present invention.

Figure 2C:
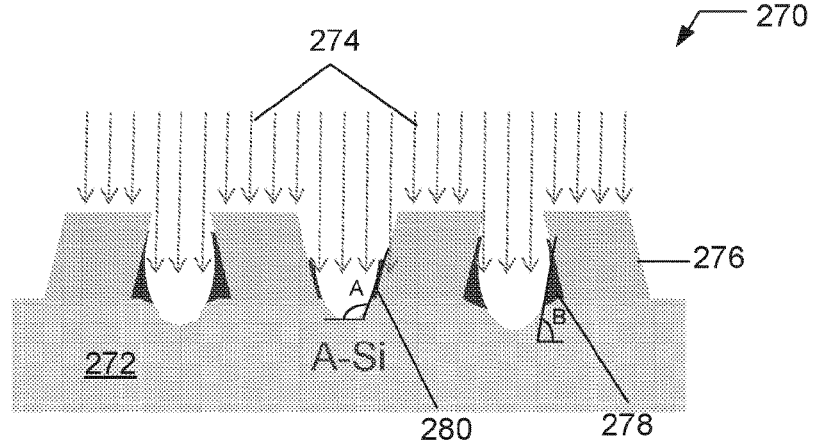
FIG. 2C is an exemplary schematic of the mechanism used to transform parallelogram-shape structures to right trapezoidal-shape structures.

FIG. 2C is an exemplary schematic 270 of the mechanism used to transform the parallelogram-shape structures of FIG. 2A to right trapezoidal-shape structures of FIG. 2B. The gas mixture used to sculpt the oxide spacer that is on top of the amorphous Si film is $HBr/CHF_3/Ar$ and will be discussed more in relation to sculpting above. H—Br—C—F—Si—O forms a deposition as the gas etches the amorphous Si 272 and the oxide spacer 276. The ions 274 are in contact with the spacer 276 along the side wall of the oxide spacer 276 and deposition will depend on the geometry of the oxide spacer 276 and the angles of the oxide spacer 276. Angles that are greater than 90 degrees, such as angle A, will see less deposition 280 due to less surface coverage for by-product to stick on and more surface coverage for energetic ion 274 sputtering and chemical reaction to remove the by-product. Angles that are less than 90 degrees, such as B, will see more deposition 278 due to more surface coverage for by-product to stick on with less surface coverage for energetic ion sputtering and chemical reaction to remove the by-product. The parallelogram shape structures in FIG. 2A transform into the right trapezoidal shape structures in FIG. 2C.

As depicted in FIGS. 2A-2C, for a right leaning parallelogram-shaped structure (e.g., structure 212), the acute angle is on the right side of the structure, and the sculpting process causes deposition on the right side to convert the acute angle essentially to a right angle, resulting in the right-angled trapezoidal shape with a left side leaning to the right and adjacent right angles on the right side (e.g., structure 262). For a left leaning parallelogram-shaped structure (e.g., structure 216), the acute angle is on the left side of the structure, and the sculpting process causes deposition on the left side to convert the acute angle essentially to a right angle, resulting in the right-angled trapezoidal shape with a right side leaning to the left and adjacent right angles on the left side (e.g., structure 266).

Figure 3A:
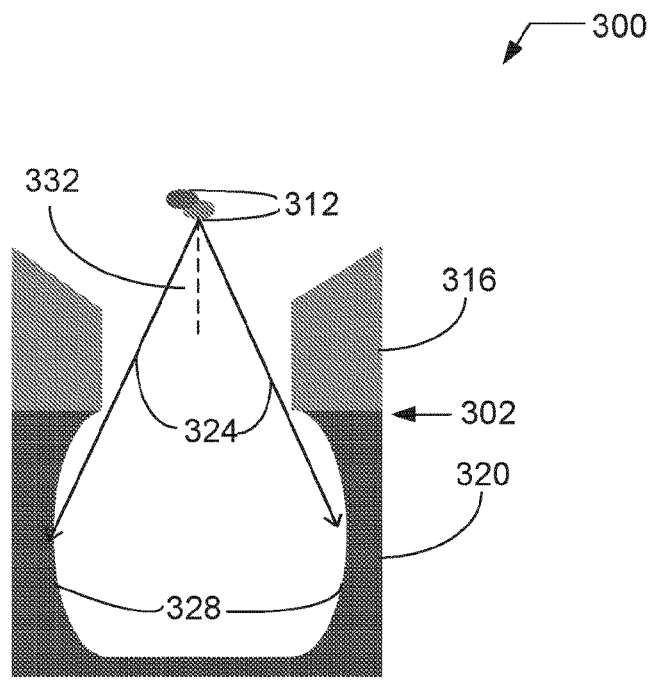

FIG. 3A is an exemplary schematic 300 of a structure profile where process parameters are adjusted to affect the collision path of the ions in one embodiment of the present invention. Referring to FIG. 3A, FIG. 3A is an exemplary schematic 300 of a structure profile 302 where process parameters in the integration scheme are adjusted to affect the collision path of the ions 324 from an ion source 312. For example, the pressure inside the chamber and the power applied to the ion source 312 are adjusted to affect the collision path. The ion beams 324 cause a notching 328 in the mask 370 below the spacer oxide 316. A passivation step is added to the process and the mask 320 is sculpted to reduce the glancing angle 332.

Figure 3B:
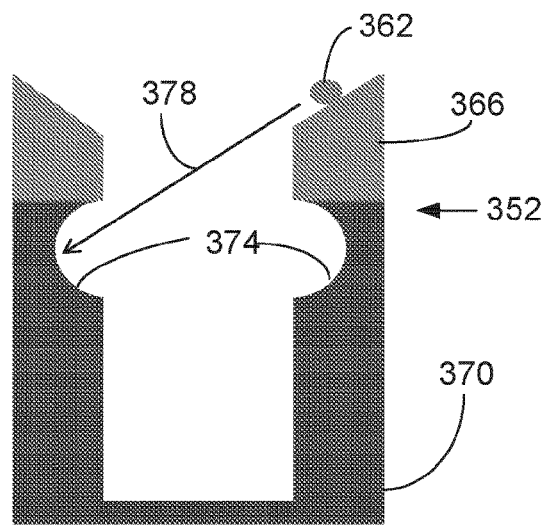
FIG. 3B is an exemplary schematic of a structure profile fabricated where mask faceting is used to reduce bowing of the structure in one embodiment of the present invention.

FIG. 3B is an exemplary schematic 350 of a structure profile where mask faceting is used to reduce bowing of the structure in one embodiment of the present invention. Referring to FIG. 3B, FIG. 3B is an exemplary schematic 350 of a structure profile 352 where the mask 370 height is increased to over 35% of the feature depth. The ion source 362 generates an ion beam 378 that creates a notch 374 in the a-Si layer mask 370 near the top of the mask 370, below the spacer oxide 366. A passivation step is added to the process, the passivation step using a carbon-containing polymer. Another step is performed to increase mask selectivity and the mask 370 is sculpted to reduce the glancing angle.

Figure 4A:
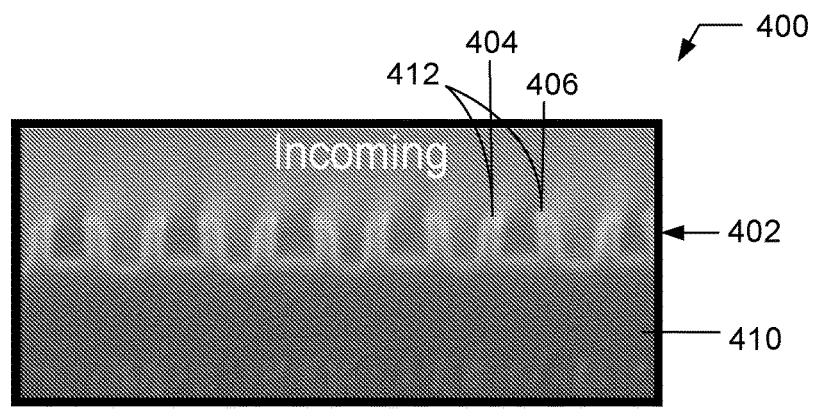
FIG. 4A is an exemplary image of structures in an incoming substrate prior to the sculpting process in an embodiment of the present invention.

FIG. 4A is an exemplary image 400 of incoming structures on a substrate prior to the sculpting process in an embodiment of the present invention. The image 400 displays structures 402 above the underlying layer 410. The first structure 404 of the structure pair 412 has a parallelogram shape that is leaning to right and a second structure 406 of the structure pair 412 has a parallelogram shape that is leaning to the left.

Figure 4B:
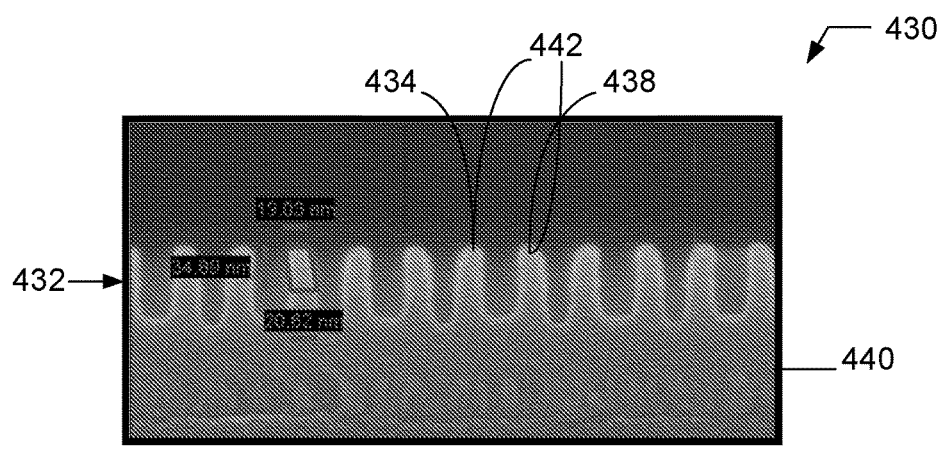
FIG. 4B is an exemplary image of structures in a substrate after a partial main etch process with no prior sidewall sculpting.

FIG. 4B is an exemplary image 430 of structures on a substrate after a breakthrough etch process to remove native oxide and a partial main etch with HBr and Ar. The image 430 displays structures 432 in and above the underlying layer 440. The first structure 434 of the structure pair 442 has a parallelogram shape that is leaning to the right. A second structure 438 of the structure pair 442 has a parallelogram shape that is leaning to the left.

Figure 4C:
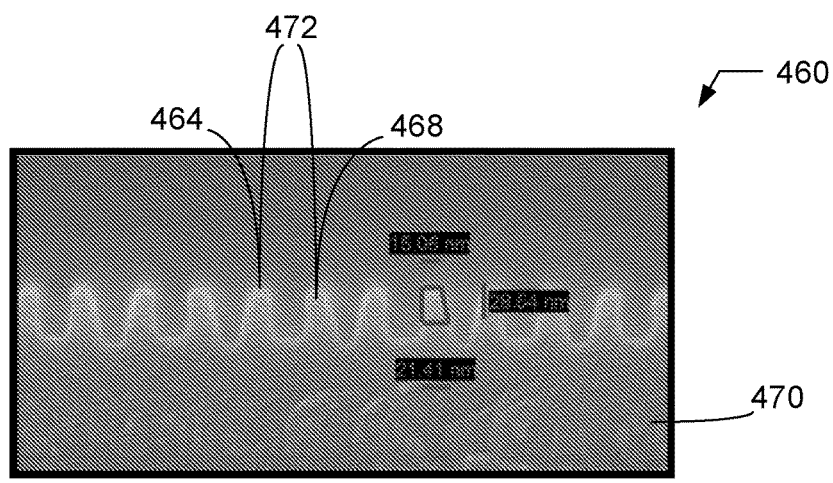
FIG. 4C is an exemplary image of a substrate after the spacer oxide sculpting process.

FIG. 4C is an exemplary image 460 of structures in a substrate after the breakthrough etch process and the spacer oxide sculpting process, which is performed prior to a main etch process. The image 460 displays structure pairs 472 above the underlying layer 470. The first structure 464 of the structure pair 472 has a trapezoidal shape with the slanted side on the left and a right angle side on the right. The second structure 468 of the structure pair 472 has a trapezoidal shape with the right angle side on the left and the slanted side on the right. The right angle side of the first structure 464 and the right angle side of the second structure 468 are substantially straight and as such, will provide better profile results in subsequent processing of the substrate.

Figure 5A:
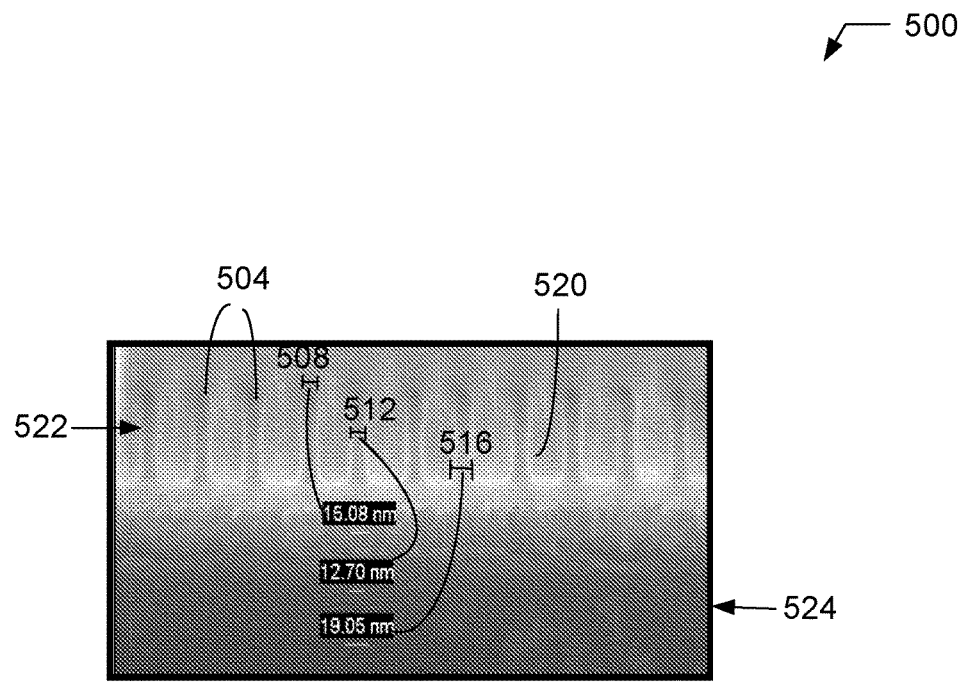
FIG. 5A is another exemplary image of structures in a substrate highlighting the hour-glass shape of the amorphous silicon profile of the structure.

FIG. 5A is another exemplary image 500 of structures in a substrate highlighting the hour-glass shape of the amorphous silicon profile of the structures 522 without performance of the spacer oxide sculpting process. Structure pairs 504 above the silicon nitride layer 524 show the hour-glass shapes 520 when the spacer oxide sculpting process was not performed. The hour-glass shape 520 in the structure profile of the structure pair 504 is further reinforced by the measurements made on the image 500 where the top critical dimension (CD) 508 is 15.08 nm, the middle CD 512 is 12.70 nm, and the bottom CD 516 is 19.05 nm.

Figure 5B:
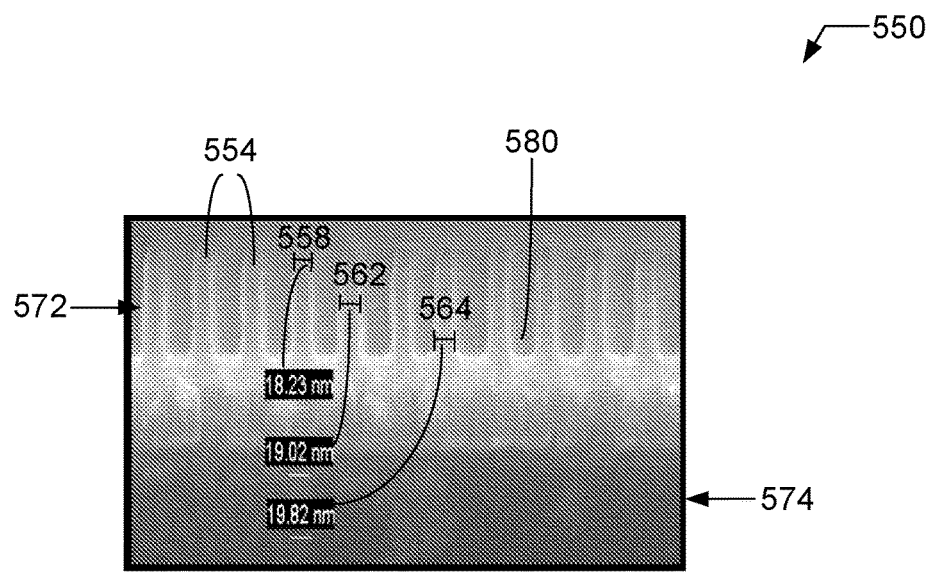
FIG. 5B is an exemplary image of structures in a substrate after the main etch process where the spacer sculpting process of the present invention was used highlighting the elimination of the hour glass-shape of the transferred pattern profile.

FIG. 5B is an exemplary image 550 of structures in a substrate where the spacer sculpting process of the present invention was performed prior to the main etch process. Structures 572 above the silicon nitride layer 574 highlight the improved profile with a straighter shape 580 when the spacer oxide sculpting process was performed. In a single structure pair 554, the straighter shape 580 is distinctly highlighted. The overall improvement in structure shapes is further reinforced by the measurements made on the image 550 where the top critical dimension (CD) 558 is 18.23 nm, the middle CD 562 is 19.02 nm, and the bottom CD 564 is 19.82 nm. The median of the critical dimensions in FIG. 5B is closer to the average CD compared to the corresponding dimensions in FIG. 5A.

Figure 6A:
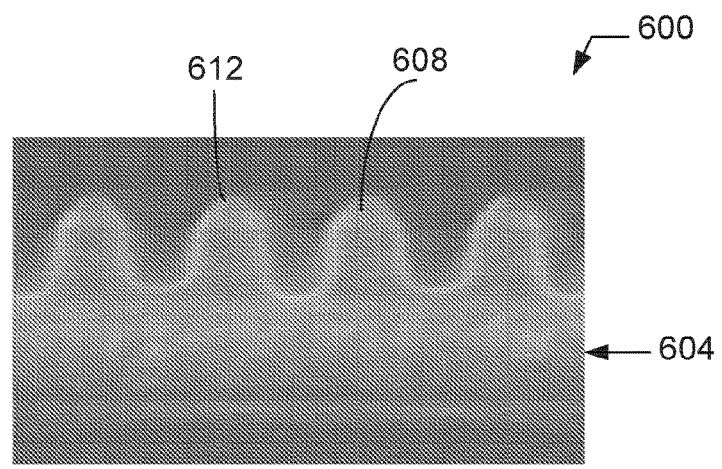
FIG. 6A is an exemplary image of structures in a substrate after breakthrough etch and sculpting processes and a 37-second main etch using HBr.

FIG. 6A, FIG. 6B, FIG. 6C, FIG. 6D, and FIG. 6E are exemplary images highlighting the use of spacer sidewall sculpting to avoid causing an undercut (hour glass shape) in the amorphous silicon layers of the substrate and creating a recess into the $Si_3N_4$ layers. FIG. 6A is an exemplary image 600 of structures 608 and 612 after breakthrough etch and sculpting processes and a 37-second main etch using HBr where the undercut (hour glass shape) of the amorphous silicon layer 604 was avoided and no recess in the $Si_3N_4$ layer 606 was created.

Figure 6B:
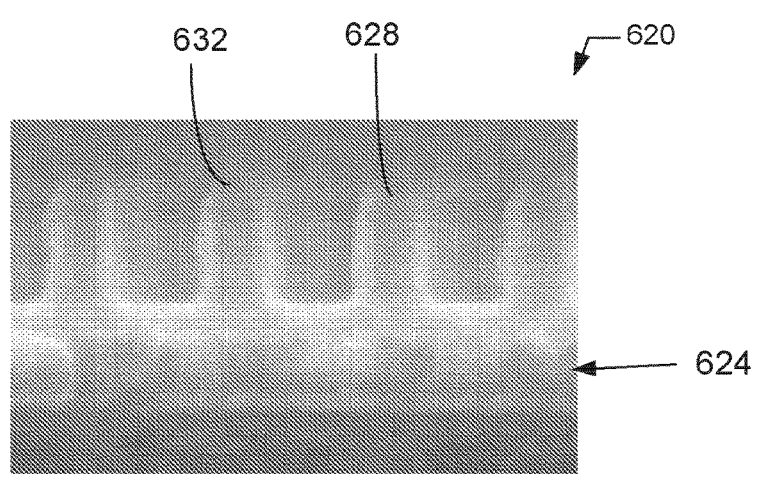
FIG. 6B is an exemplary image of structures in a substrate after breakthrough etch and sculpting processes and a 37-second main etch using HBr and a 30-second HBr overetch.

FIG. 6B is an exemplary image 620 of structures in a substrate highlighting adjacent structures 628 and 632 after breakthrough etch and sculpting processes and a 37-second main etch using HBr and a 30-second HBr overetch, where the undercut (hour glass shape) of the amorphous silicon layer 624 was avoided and no recess in the $Si_3N_4$ layer 626 was created.

Figure 6C:
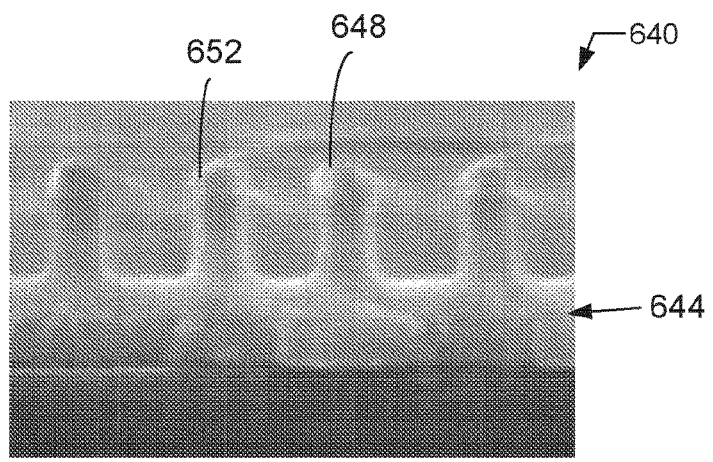
FIG. 6C is an exemplary image of structures in a substrate after breakthrough etch and sculpting processes and a 42-second-main etch using HBr and a 30-second HBr overetch.

FIG. 6C is an exemplary image 640 of structures in a substrate highlighting adjacent structures 648 and 652 after breakthrough etch and sculpting processes and a 42-second main etch using HBr and a 30-second HBr overetch, where the undercut (hour glass shape) of the amorphous silicon layer 644 was avoided and no recess in the $Si_3N_4$ layer 646 was created.

Figure 6D:
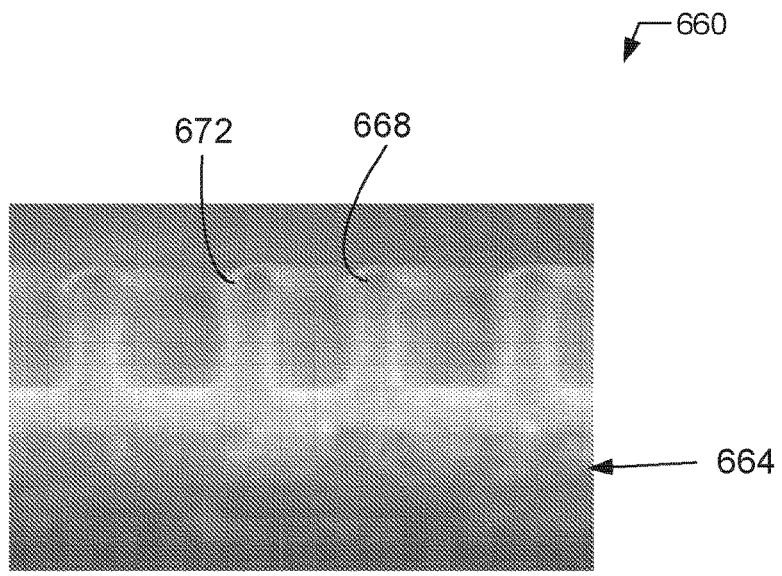
FIG. 6D is an exemplary image of structures in a substrate after breakthrough etch and sculpting processes and a 37-second main etch using HBr and a 40-second HBR overetch.

FIG. 6D is an exemplary image 660 of structures in a substrate highlighting adjacent structures 668 and 672 after breakthrough etch and sculpting processes and a 37-second main etch using HBr and a 40-second HBr overetch where the undercut (hour glass shape) of the amorphous silicon layer 664 was avoided and no recess in the $Si_3N_4$ layer 666 was created.

Figure 6E:
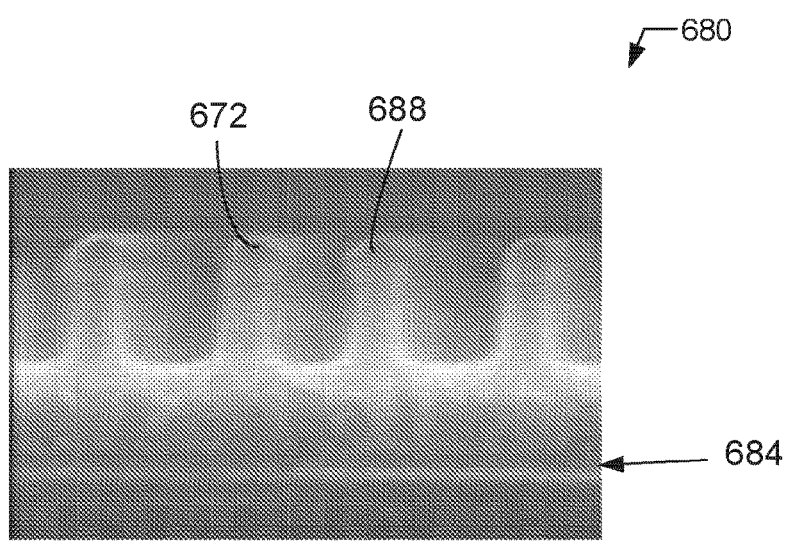
FIG. 6E is an exemplary image of structures in a substrate after breakthrough etch and sculpting processes and a 37-second main etch using HBr and a 40-second $Cl_2$ overetch.

FIG. 6E is an exemplary image 680 of structures in a substrate highlighting adjacent structures 688 and 672 after breakthrough etch and sculpting processes and a 37-second main etch using HBr and a 40-second $Cl_2$ overetch where the undercut (hour glass shape) of the amorphous silicon layer 684 was avoided and a small recess in the $Si_3N_4$ layer 686 was created by the $Cl_2$ gas used for the overetch.

Figure 7A:
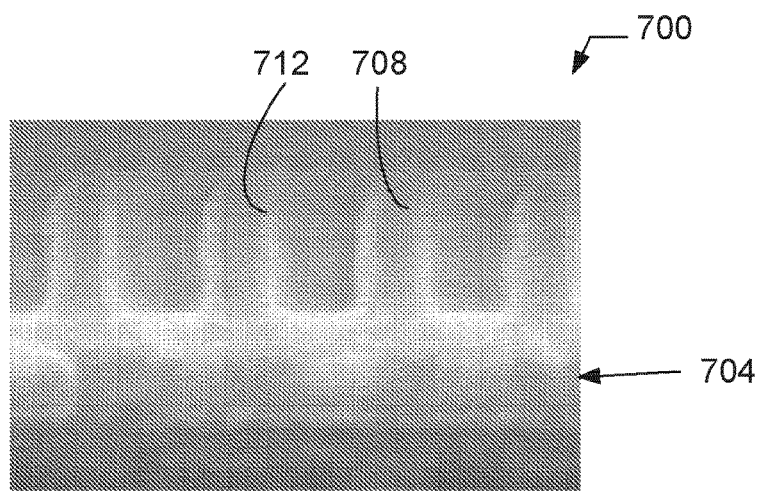
FIG. 7A is an exemplary image of structures in a substrate after breakthrough etch and sculpting processes and a 37-second main etch using HBr and a 30-second HBr overetch where the spacer sidewall sculpting process was optimized.

FIG. 7A, FIG. 7B, FIG. 7C, FIG. 7D, and FIG. 7E are exemplary images of structures in a substrate utilizing a spacer sidewall sculpting process highlighting control of the operating variables used in the spacer sidewall sculpting process. FIG. 7A is an exemplary image 700 of adjacent structures 708 and 712 in a substrate after breakthrough etch and sculpting processes and a 37-second main etch using HBr and a 30-second HBr overetch were performed where selected operating systems variables of the spacer sidewall sculpting process were optimized. Specifically, the sculpting process was performed for 15 seconds with 10 mTorr pressure, 100 W low frequency power, 150 W high frequency power, 55° C. electrostatic chuck (ESC) temperature, 300 sccm HBr, 12 sccm $CH_3F$ and 100 sccm Ar. The structures 708 and 712 are disposed in the amorphous silicon layer 704 and above the $Si_3N_4$ layer 706.

Figure 7B:
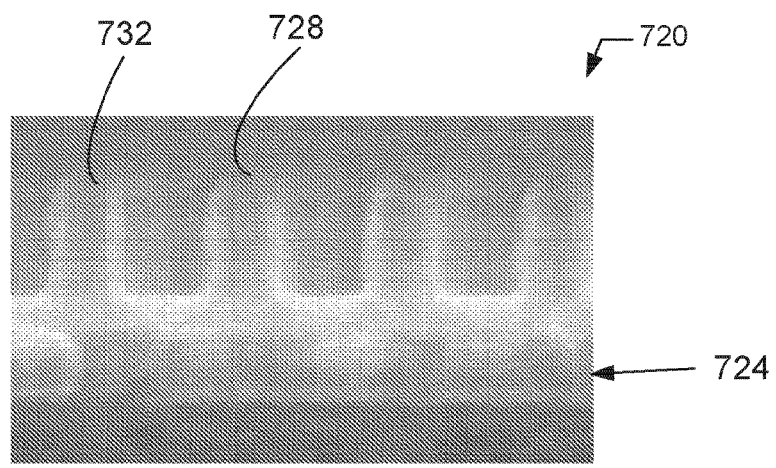
FIG. 7B is an exemplary image of structures in a substrate where the sculpting process was performed at 30 mT.

FIG. 7B is an exemplary image 720 of adjacent structures 728 and 732 in a substrate after the same process steps were performed as in FIG. 7A, but the sculpting process was performed at a pressure of about 30 mTorr while the other operating variables were held constant. The structures 728 and 732 are disposed in the amorphous silicon layer 724 and above the Si$_3$N$_4$ layer 726.

Figure 7C:
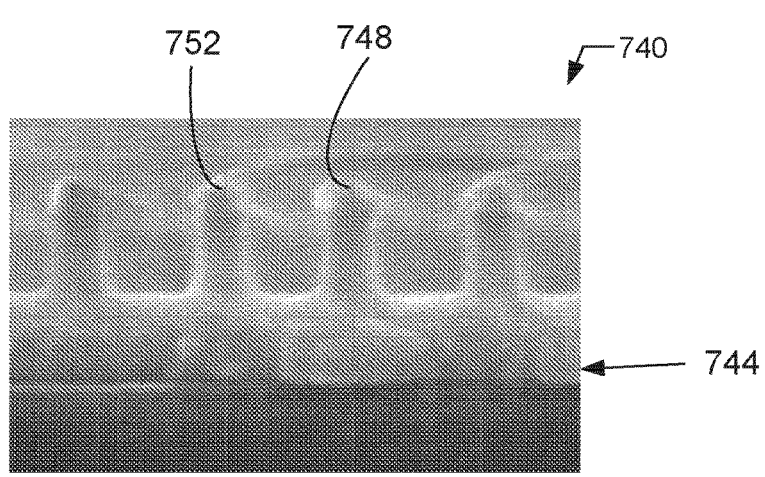
FIG. 7C is an exemplary image of structures in a substrate where the sculpting process was performed at 500 W low frequency.

FIG. 7C is an exemplary image 740 of adjacent structures 748 and 752 in a substrate after the same process steps were performed as in FIG. 7A, but the sculpting process was performed at a power of about 500 W low frequency while the other operating variables were held constant. The structures 748 and 752 are disposed in the amorphous silicon layer 744 and above the Si$_3$N$_4$ layer 746.

Figure 7D:
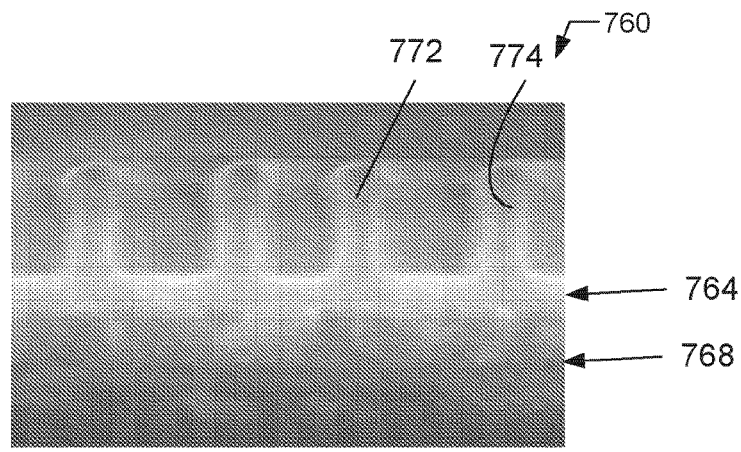
FIG. 7D is an exemplary image of structures in a substrate where the sculpting process was performed at 550 W high frequency.

FIG. 7D is an exemplary image 760 of adjacent structures 772 and 774 of a substrate after the same process are steps were performed as in FIG. 7A, but the sculpting process was performed at a power of about 550 W high frequency while the other operating variables were held constant. The structures 772 and 774 are disposed in the amorphous silicon layer 764 and above the Si$_3$N$_4$ layer 768.

Figure 7E:
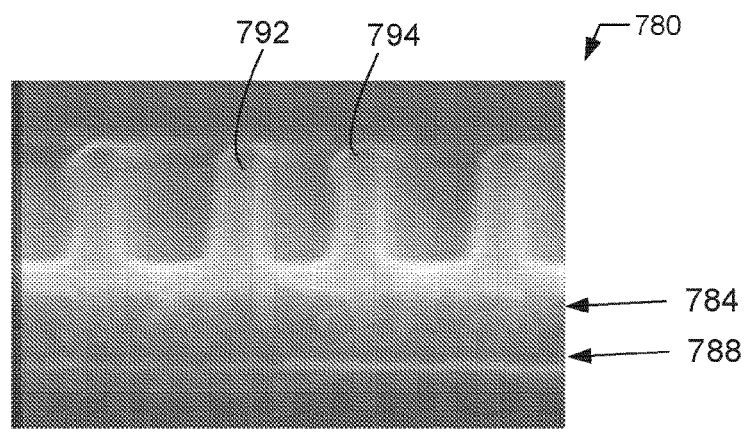
FIG. 7E is an exemplary image of structures in a substrate where the sculpting process was performed at 25° C. electrostatic chuck temperature.

FIG. 7E is an exemplary image 780 of adjacent structures 792 and 794 after the same process steps were performed as in FIG. 7A, but the sculpting process was performed at an ESC temperature of 25° C. while the other operating variables were held constant. The structures 792 and 794 are disposed in the amorphous silicon layer 784 and above the Si$_3$N$_4$ layer 788. The tests conducted using ranges of one or more variables while holding other variables constant indicated that best profile results were obtained using combinations of low pressure, low power applied in the chamber, and high electrostatic chuck (ESC) temperature and these results were better than expected.

In one embodiment, the spacer sidewall sculpting process is performed using a high frequency power in a range from 0 to 1,500 watts, where high frequency is in a range from 50 to 70 MHz, a low frequency power in a range from 0 to 900 watts where low frequency is in a range from 11 to 15 MHz, and an electrostatic chuck (substrate holder) temperature in a range from −10 to 80 degrees C. Further, in one embodiment, the HBr flow rate is in a range from 1 to 583 sccm, the CH$_3$F flow rate is in a range from 1 to 232 sccm, and the Ar flow rate is in a range from 0 to 1,775 sccm. Further, in one embodiment, a radical distribution control (RDC) of the process chamber is in a range from 5 to 95%, a temperature of an upper electrode is in a range from 40 to 80 degrees C., a temperature of a wall of the process chamber is in a range from 40 to 80 degrees C., and a temperature of a chiller in the process chamber is in a range from −10 to 80 degrees C. Further, in one embodiment, the spacer sidewall sculpting process is performed with a pressure in a range from 7 to 900 mTorr for a time in a range of 10 to 30 seconds.

According to one embodiment, the spacer sidewall sculpting process results in a ratio of a top critical dimension (CD) to a bottom CD of the structures in the amorphous silicon layer being in a range from 0.92 to 1.00, and a ratio of a middle CD to the bottom CD being in a range from 0.90 to 1.00.

Figure 8:
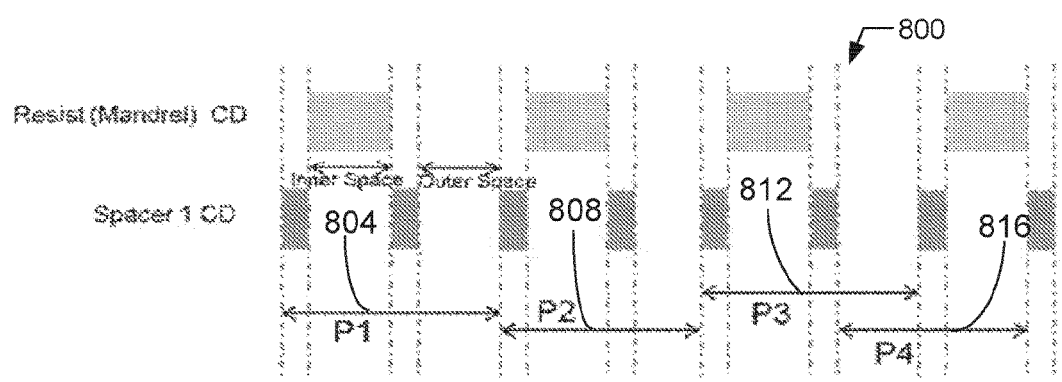
FIG. 8 is a schematic of how the pitch imbalance is calculated.

FIG. 8 is a schematic 800 of how the pitch imbalance is calculated. Pitch imbalance is an integration scheme metric that is used to measure the integrated results of the various processes as well as the optimization of operating variables in the integration scheme. One objective of the sculpting process is to minimize the pitch imbalance, i.e., get it as close to zero as much as possible. Pitch imbalance is expressed quantitatively using the following equation:

Pitch Imbalance=Sum[abs($P1$–$P2$), abs($P2$–$P3$), abs ($P3$–$P4$), abs ($P4$–$P1$)]   Equation 1.0 where:

P1 (804)=first spacer CD+first resist mandrel+second spacer CD+second resist mandrel;
P2 (808)=second spacer CD+second resist mandrel+third spacer CD+third resist mandrel;
P3 (812)=third spacer CD+third resist mandrel+fourth spacer CD+fourth resist mandrel; and
P4 (816)=fourth spacer CD+fourth resist mandrel+first spacer CD+first resist mandrel.

Figures 9A, 9B:
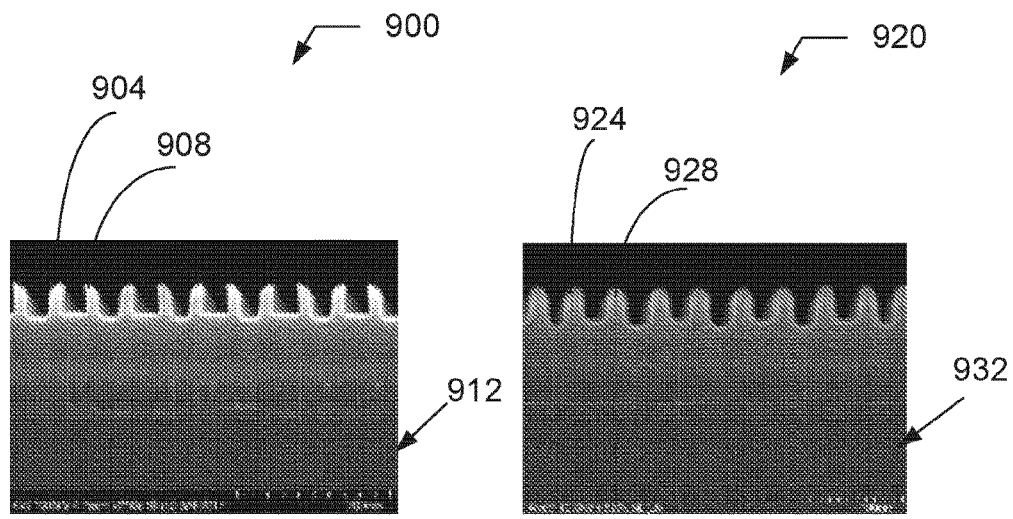
FIG. 9A is an exemplary image of oxide spacer structures prior to a sculpting process, FIG. 9B an exemplary image of the oxide spacer structures after the sculpting process, FIG. 9C an exemplary image of the oxide spacer structures after the main etch.
Figures 9C, 9D:
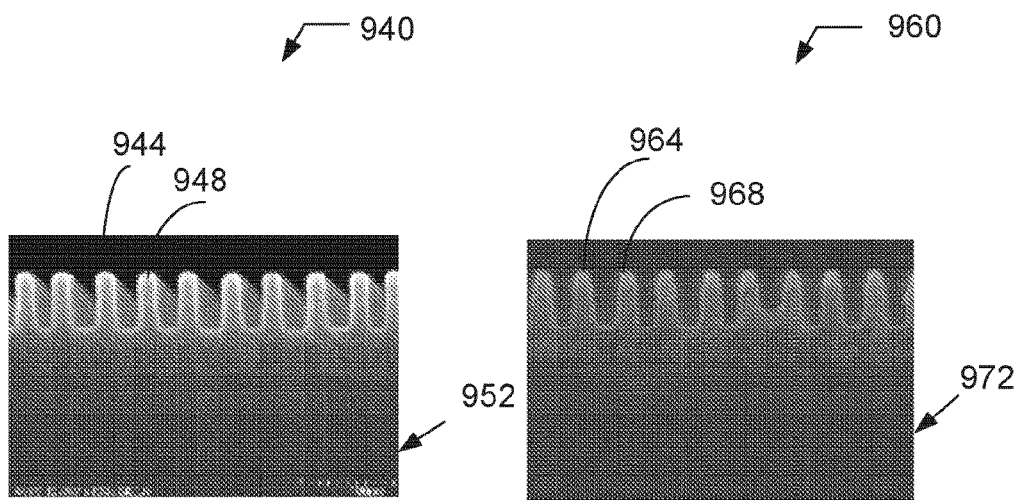
FIG. 9D is an exemplary image of the oxide spacer structures after the over etch, according to an embodiment of the present invention.

FIG. 9A is an exemplary image 900 of pairs of oxide spacer structures, such as 904 and 908, above an underlying layer 912 after a breakthrough etch but prior to the sculpting process. As expected, the pair of oxide spacer structures 904 and 908 had parallelogram shapes. FIG. 9B is an exemplary image 920 of pairs of oxide spacer structures, for example, 924 and 928, above an underlying layer 932 after the sculpting process. The pair of oxide spacer structures 924 and 928 had trapezoidal shapes. FIG. 9C depicts an exemplary image 940 of pairs of oxide spacer structures, for example, 944 and 948, above the silicon nitride layer 952 after the main etch. The pair of oxide spacer structures, 944 and 948, highlights the improved profile in the amorphous silicon as a result of the previous sculpting process. Similarly, in FIG. 9D depicts an exemplary image 960 of oxide spacer structures, for example, 964 and 968, above the silicon nitride layer 972 after the over etch in an embodiment of the present invention. As mentioned above, the pair of oxide spacer structures, 964 and 968, highlight the improved profile of the structures as a result of the previous sculpting process in the integration scheme.

Figure 10:
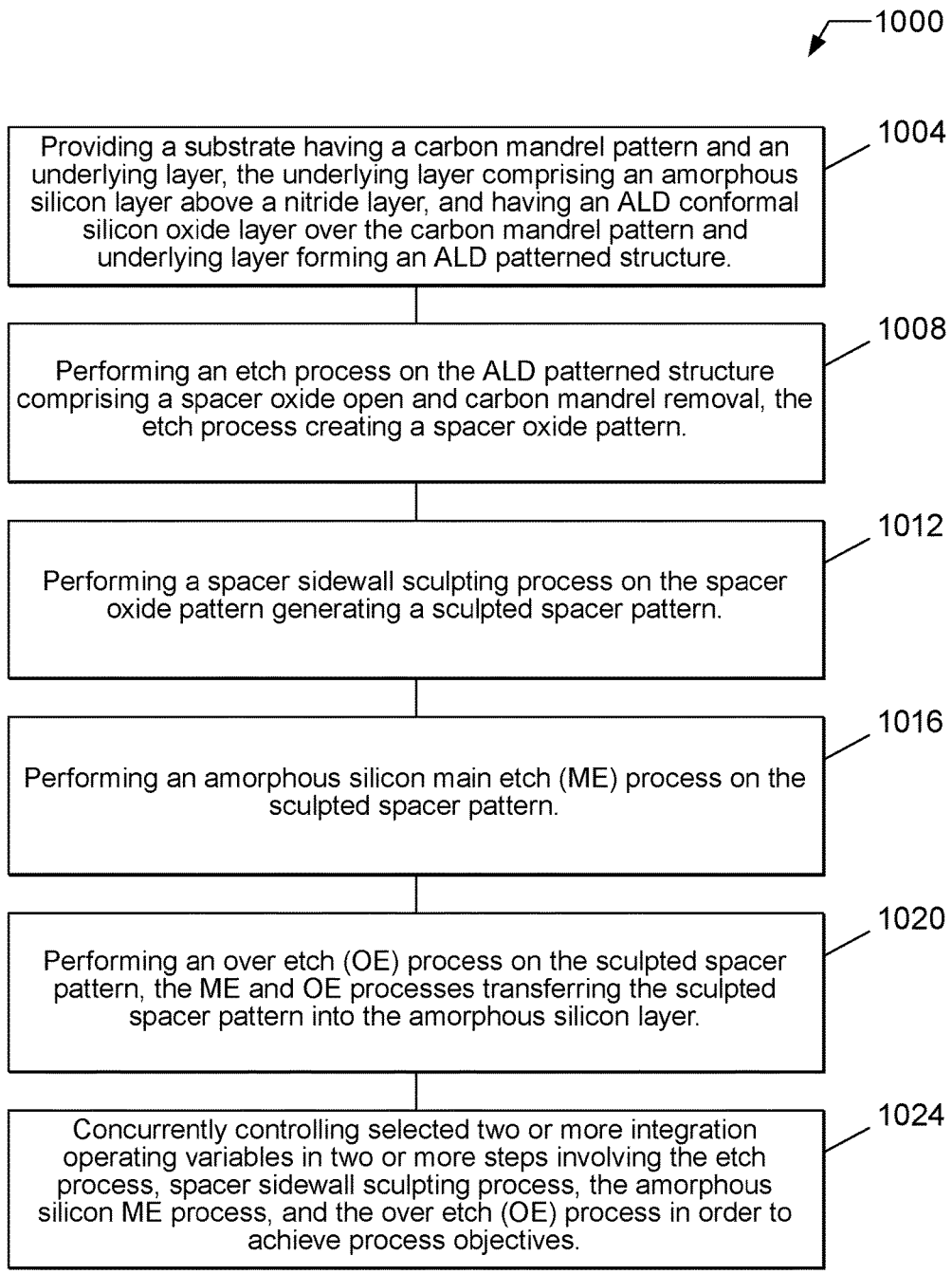
FIG. 10 is an exemplary flowchart of a method of processing an oxide spacer structure using a sculpting process to achieve processing objectives.

FIG. 10 is an exemplary flowchart 1000 of a method of processing an oxide spacer structure using a sculpting process to achieve integration objectives. The integration objectives can include fabricating the profile of the structures without an undercut and without a recess in the underlying layer, minimizing pitch imbalance, improving etch uniformity, reducing processing time, and the like. Integration objectives involving the profile of the structures can be measured in the extent of notching or bowing of the structure pair, straightness of the right angle sides of the trapezoidal profile, low pitch imbalance, high structure uniformity measured by the ratio of top CD to bottom CD and/or ratio of medium CD to bottom CD, and the like.

Referring to FIG. 10, in operation 1004, a substrate is provided having a carbon mandrel pattern and an underlying layer, the underlying layer comprising an amorphous silicon layer above a silicon nitride layer, and having a conformal silicon oxide layer deposited by atomic layer disposition (ALD) over the carbon mandrel pattern and underlying layer forming an ALD patterned structure. In operation 1008, an etch process is performed including a spacer oxide open and carbon mandrel removal, creating a spacer oxide pattern.

In operation 1012, a spacer sidewall sculpting process is performed on the spacer oxide pattern generating a sculpted spacer pattern. In operation 1016, an amorphous silicon main etch (ME) process on the sculpted spacer pattern is performed.

In operation 1020, an over etch (OE) process is performed, the ME and OE processes transferring the sculpted spacer pattern into the amorphous silicon layer.

In operation 1024, selected two or more integration operating variables in two or more steps involving the etch process, spacer sidewall sculpting process, the amorphous silicon ME process, and the over etch (OE) process are concurrently controlled in order to achieve integration process objectives.

Figure 11:
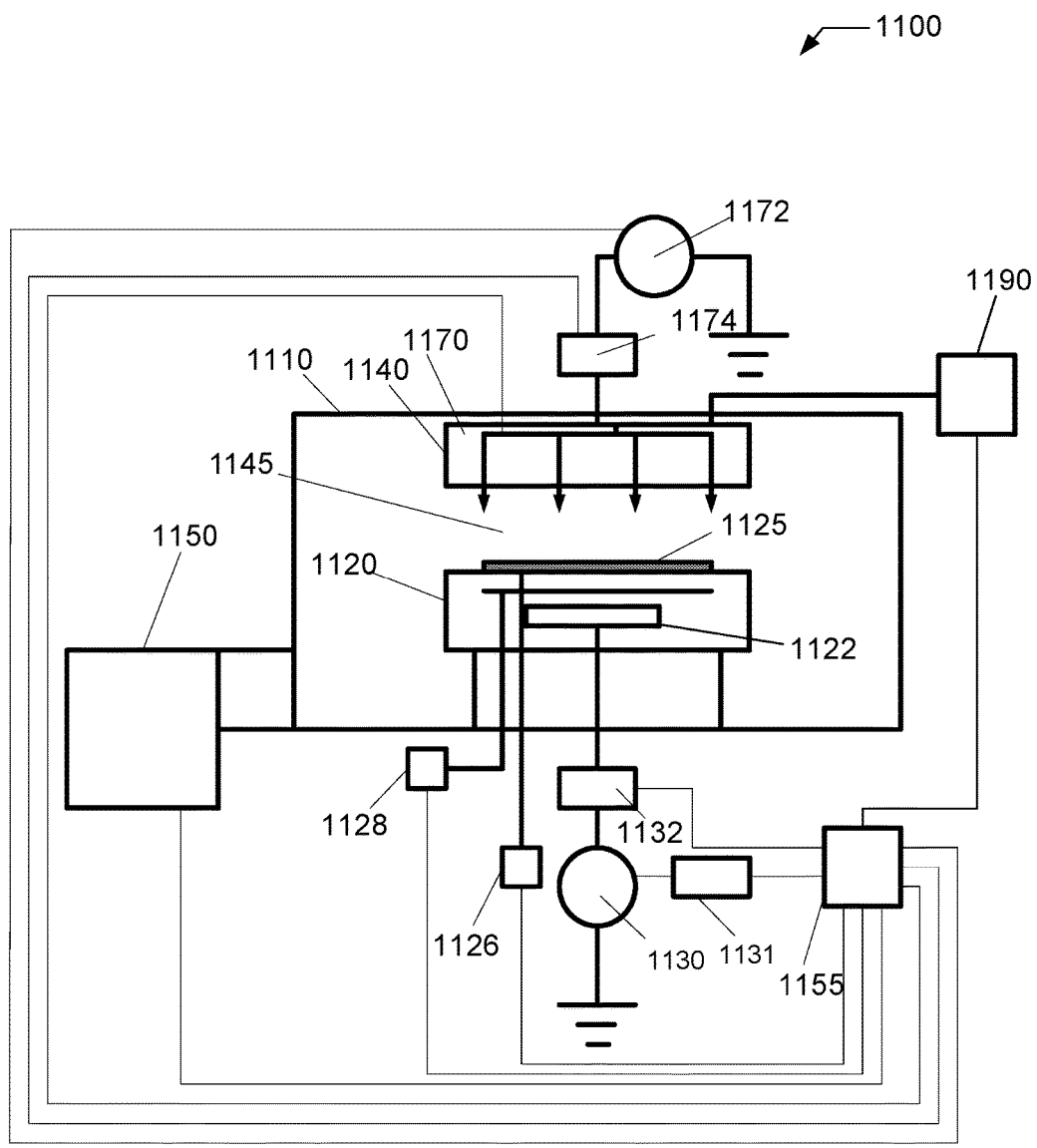
FIG. 11 depicts an exemplary processing system to perform the sculpting process for oxide spacer structures in one embodiment of the present invention.

FIG. 11 depicts an exemplary processing system to perform the sculpting process for an oxide spacer structure in one embodiment of the present invention. A plasma processing system 1100 configured to perform the above identified process conditions is depicted in FIG. 11 comprising a plasma processing chamber 1110, substrate holder 1120, upon which a substrate 1125 to be processed is affixed, and vacuum pumping system 1150. Substrate 1125 can be a semiconductor substrate, a wafer, a flat panel display, or a liquid crystal display. Plasma processing chamber 1110 can be configured to facilitate the generation of plasma in plasma processing region 1145 in the vicinity of a surface of substrate 1125. An ionizable gas or mixture of process gases is introduced via a gas distribution system 1140. For a given flow of process gas, the process pressure is adjusted using the vacuum pumping system 1150. Plasma can be utilized to create materials specific to a pre-determined materials process, and/or to aid the removal of material from the exposed surfaces of substrate 1125. The plasma processing system 1100 can be configured to process substrates of any desired size, such as 200 mm substrates, 300 mm substrates, or larger.

Substrate 1125 can be affixed to the substrate holder 1120 via a clamping system 1128, such as a mechanical clamping system or an electrical clamping system (e.g., an electrostatic clamping system). Furthermore, substrate holder 1120 can include a heating system (not shown) or a cooling system (not shown) that is configured to adjust and/or control the temperature of substrate holder 1120 and substrate 1125. The heating system or cooling system may comprise a re-circulating flow of heat transfer fluid that receives heat from substrate holder 1120 and transfers heat to a heat exchanger system (not shown) when cooling, or transfers heat from the heat exchanger system to substrate holder 1120 when heating. In other embodiments, heating/cooling elements, such as resistive heating elements, or thermo-electric heaters/coolers can be included in the substrate holder 1120, as well as the chamber wall of the plasma processing chamber 1110 and any other component within the plasma processing system 1100.

Additionally, a heat transfer gas can be delivered to the backside of substrate 1125 via a backside gas supply system 1126 in order to improve the gas-gap thermal conductance between substrate 1125 and substrate holder 1120. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 1125.

In the embodiment shown in FIG. 11, substrate holder 1120 can comprise an electrode 1122 through which RF power is coupled to the processing plasma in plasma processing region 1145. For example, substrate holder 1120 can be electrically biased at a RF voltage via the transmission of RF power from a RF generator 1130 through an optional impedance match network 1132 to substrate holder 1120. The RF electrical bias can serve to heat electrons to form and maintain plasma. In this configuration, the plasma processing system 1100 can operate as a reactive ion etch (RIE) reactor, wherein the chamber and an upper gas injection electrode serve as ground surfaces. A typical frequency for the RF bias can range from about 0.1 MHz to about 110 MHz. RF systems for plasma processing are well known to those skilled in the art.

Furthermore, the electrical bias of electrode 1122 at a RF voltage may be pulsed using pulsed bias signal controller 1131. The RF power output from the RF generator 1130 may be pulsed between an off-state and an on-state, for example. Alternately, RF power is applied to the substrate holder electrode at multiple frequencies. Furthermore, impedance match network 1132 can improve the transfer of RF power to plasma in plasma processing chamber 1110 by reducing the reflected power. Match network topologies (e.g. L-type, π-type, T-type, etc.) and automatic control methods are well known to those skilled in the art.

Gas distribution system 1140 may comprise a showerhead design for introducing a mixture of process gases. Alternatively, gas distribution system 1140 may comprise a multi-zone showerhead design for introducing a mixture of process gases and adjusting the distribution of the mixture of process gases above substrate 1125. For example, the multi-zone showerhead design may be configured to adjust the process gas flow or composition to a substantially peripheral region above substrate 1125 relative to the amount of process gas flow or composition to a substantially central region above substrate 1125.

Vacuum pumping system 1150 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 1100 to 3000 liters per second TMP can be employed. TMPs are useful for low pressure processing, typically less than about 50 mTorr. For high pressure processing (i.e., greater than about 110 mTorr), a mechanical booster pump and dry roughing pump can be used. Furthermore, a device for monitoring chamber pressure (not shown) can be coupled to the plasma processing chamber 1110.

As mentioned above, the controller 1155 can comprise a microprocessor, memory, and a digital I/O port capable of generating control voltages sufficient to communicate and activate inputs to plasma processing system 1100 as well as monitor outputs from plasma processing system 1100. Moreover, controller 1155 can be coupled to and can exchange information with RF generator 1130, pulsed bias signal controller 1131, impedance match network 1132, the gas distribution system 1140, the gas supply 1190, vacuum pumping system 1150, as well as the substrate heating/cooling system (not shown), the backside gas supply system 1126, and/or the electrostatic clamping system 1128. For example, a program stored in the memory can be utilized to activate the inputs to the aforementioned components of plasma processing system 1100 according to a process recipe in order to perform a plasma assisted process, such as a plasma etch process, on substrate 1125.

In addition, the plasma processing system 1100 can further comprise an upper electrode 1170 to which RF power can be coupled from RF generator 1172 through optional impedance match network 1174. A frequency for the application of RF power to the upper electrode can range from about 0.1 MHz to about 200 MHz. Additionally, a frequency for the application of power to the lower electrode can range from about 0.1 MHz to about 110 MHz. Moreover, controller 1155 is coupled to RF generator 1172 and impedance match network 1174 in order to control the application of RF power to upper electrode 1170. The design and implementation of an upper electrode is well known to those skilled in the art. The upper electrode 1170 and the gas distribution system 1140 can be designed within the same chamber assembly, as shown. Alternatively, upper electrode 1170 may comprise a multi-zone electrode design for adjusting the RF power distribution coupled to plasma above substrate 1125. For example, the upper electrode 1170 may be segmented into a center electrode and an edge electrode.

Depending on the applications, additional devices such as sensors or metrology devices can be coupled to the plasma processing chamber 1110 and to the controller 1155 to collect real time data and use such real time data to concurrently control two or more selected integration operating variables in two or more steps involving deposition processes, RIE processes, pull processes, profile reformation processes, and/or pattern transfer processes of the integration scheme. Furthermore, the same data can be used to ensure integration targets including patterning uniformity (uniformity), pulldown of structures (pulldown), slimming of structures (slimming), aspect ratio of structures (aspect ratio), line width roughness, line edge roughness, and the like are achieved.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of forming a spacer sidewall mask, the method comprising:
   providing a substrate in a process chamber, the substrate having a carbon mandrel pattern formed on an underlying layer comprising an amorphous silicon layer above a silicon nitride layer, and a conformal silicon oxide layer deposited by atomic layer deposition (ALD) over the carbon mandrel pattern and underlying layer forming an ALD patterned structure;
   performing an etch process on the ALD patterned structure comprising a spacer oxide open and carbon mandrel removal, the etch process creating a spacer oxide pattern comprising a first spacer sub-structure having a parallelogram shape leaning to the right and a second spacer sub-structure having a parallelogram shape leaning to the left;
   performing a spacer sidewall sculpting process on the spacer oxide pattern generating a sculpted spacer pattern, the spacer sidewall sculpting process comprising transforming the first spacer sub-structure to a first sculpted spacer sub-structure having a right trapezoidal shape with a left side leaning to the right and a right angle on the right side and transforming the second spacer sub-structure to a second sculpted spacer sub-structure having a right trapezoidal shape with a right side leaning to the left and a right angle on the left side;
   performing an amorphous silicon main etch (ME) process on the sculpted spacer pattern, the ME process transferring the sculpted spacer pattern into the amorphous silicon layer; and
   performing an over etch (OE) process on the sculpted spacer pattern, the OE process further transferring the sculpted spacer pattern into the amorphous silicon layer.

2. The method of claim 1 wherein the spacer sidewall sculpting process utilizes HBr/CH$_3$F/Ar chemicals.

3. The method of claim 2 wherein the silicon nitride layer comprises Si$_3$N$_4$.

4. The method of claim 1 wherein a ratio of a top critical dimension (CD) to a bottom CD of the transferred sculpted spacer pattern in the amorphous silicon layer is in a range from 0.92 to 1.00.

5. The method of claim 4 wherein a ratio of a middle CD to the bottom CD of the transferred sculpted spacer pattern in the amorphous silicon layer is in a range from 0.90 to 1.00.

6. The method of claim 5 further comprising selecting two or more operating variables of the spacer sidewall sculpting process including process time, pressure, high frequency energy, low frequency energy, control chuck temperature, flow rates of etch gases, percentage radical distribution control, temperature of the upper electrode, temperature of the wall in the process chamber, and temperature of the chiller in the process chamber, and concurrently controlling the selected two or more operating variables to achieve integration process objectives.

7. The method of claim 6 wherein the integration process objectives include fabricating the profile of the structures without an undercut in the amorphous silicon layer and without a recess in the silicon nitride layer, minimizing pitch imbalance, improving etch uniformity, and reducing processing time.

8. The method of claim 1 wherein the spacer sidewall sculpting process uses HBr, CH$_3$F, and Ar to etch the spacer oxide pattern and the amorphous silicon layer to form a deposition product that deposits on the right side of the first spacer sub-structure and the left side of the second spacer sub-structure.

9. The method of claim 8 wherein the main etch and overetch processes use HBr to transfer the sculpted spacer pattern into the amorphous silicon layer while stopping on the silicon nitride layer without forming a recess therein.

10. A method of forming a spacer sidewall mask, the method comprising:
    providing a substrate in a process chamber, the substrate having a spacer oxide pattern formed on an amorphous silicon layer, which is formed above a silicon nitride layer, wherein the spacer oxide pattern comprises a first plurality of right-leaning structures in which both a left and right sidewall of each structure of the first plurality lean to the right and a second plurality of left-leaning structures in which both a left and right sidewall of each structure of the second plurality lean to the left;
    optionally performing a breakthrough etch process to remove native oxide formed on the substrate;
    performing a spacer sidewall sculpting process on the spacer oxide pattern generating a sculpted spacer pattern, the spacer sidewall sculpting process transforming the right sidewall of each right-leaning structure and the left sidewall of each left-leaning structure to a non-leaning vertical sidewall;
    performing an amorphous silicon main etch process and overetch process on the sculpted spacer pattern to transfer the sculpted spacer pattern into the amorphous silicon layer, wherein the spacer sidewall sculpting process improves structure profiles in the amorphous silicon layer by reducing undercutting in the amorphous silicon layer and reducing recessing into the silicon nitride layer during the main etch and overetch processes.

11. The method of claim 10 wherein the spacer sidewall sculpting process uses HBr, CH$_3$F, and Ar, and the main etch and overetch processes use HBr.

12. The method of claim 11 wherein the spacer sidewall sculpting process etches the spacer oxide pattern and the amorphous silicon layer to form a deposition product that deposits on the right sidewall of each right-leaning structure and on the left sidewall of each left-leaning structure.

13. The method of claim 10 wherein the structure profiles in the amorphous silicon layer include a ratio of a top critical dimension (CD) to a bottom CD in a range from 0.92 to 1.00 and a ratio of a middle CD to the bottom CD in a range from 0.90 to 1.00.

14. The method of claim 10 further comprising selecting two or more operating variables of the spacer sidewall sculpting process including process time, pressure, high frequency energy, low frequency energy, control chuck temperature, flow rates of etch gases, percentage radical distribution control, temperature of the upper electrode, temperature of the wall in the process chamber, and temperature of the chiller in the process chamber, and concurrently controlling the selected two or more operating variables to achieve integration process objectives.

15. The method of claim 14 wherein the integration process objectives include fabricating the structure profiles without an undercut in the amorphous silicon layer and without a recess in the silicon nitride layer, minimizing pitch imbalance, improving etch uniformity, and reducing processing time.

16. The method of claim 10, further comprising forming the spacer oxide pattern on the amorphous silicon layer by:
   forming a carbon mandrel pattern over the amorphous silicon layer;
   depositing a conformal silicon oxide layer by atomic layer deposition over the carbon mandrel pattern and amorphous silicon layer;
   performing an oxide open etch process to remove the silicon oxide layer from top portions of the carbon mandrel pattern and from the amorphous silicon layer while the silicon oxide layer on sidewall portions of the carbon mandrel pattern remains as silicon oxide spacer sidewalls; and
   removing the carbon mandrel pattern whereby the silicon oxide spacer sidewalls form the spacer oxide pattern.

* * * * *